United States Patent [19]

Kawashima

[11] 4,061,982

[45] Dec. 6, 1977

[54] CHANNEL SELECTION APPARATUS PROVIDED WITH MEMORY FOR DIGITALIZING AND STORING CHANNEL SELECTION VOLTAGE

[75] Inventor: Kazumi Kawashima, Kyoto, Japan

[73] Assignee: Matsushita Electric Industrial Co., Ltd., Osaka, Japan

[21] Appl. No.: 652,318

[22] Filed: Jan. 26, 1976

[30] Foreign Application Priority Data

Feb. 6, 1975    Japan .................................. 50-16044

[51] Int. Cl.² ............................................. H04B 1/06
[52] U.S. Cl. ................................... 325/464; 325/468; 334/15
[58] Field of Search ............... 325/452, 453, 455, 458, 325/459, 464, 465, 468, 469, 470; 334/11, 14–16

[56] References Cited

U.S. PATENT DOCUMENTS

| | | | |
|---|---|---|---|
| 3,845,394 | 10/1974 | Hamada | 325/464 |
| 3,940,702 | 2/1976 | Yoshimura et al. | 325/464 |
| 3,968,440 | 7/1976 | Ehni | 325/464 |
| 3,968,444 | 7/1976 | Tenny | 325/470 |
| 3,990,027 | 11/1976 | Kawashima | 325/464 |

*Primary Examiner*—Robert L. Griffin
*Assistant Examiner*—Jin F. Ng
*Attorney, Agent, or Firm*—Stevens, Davis, Miller & Mosher

[57] ABSTRACT

A channel selection apparatus having a tuner including a voltage-dependent reactance element such as a varactor diode, to which one of a plurality of channel selection voltages having different magnitudes for each of the channels is applied to select a desired channel. A plurality of channel selection voltages for selecting a plurality of channels are digitalized and previously stored in a memory block at addresses corresponding to the channels. During the channel selection operation, the digital voltage signal for the channel desired to be selected is read out of the memory block and D-A converted to produce an analog channel selection voltage, which is then applied to the tuner to select the desired channel. The memory block further stores bits to indicate whether the channels are to be selected or not to be selected but skipped to select the next channel, at each of the addresses corresponding to the channels. Thus, only the required channels can be sequentially selected. No mechanical means such as variable resistors and switches are used to store the channel selection voltages and to control the skipping so that a fully electronic, highly reliable apparatus is provided.

5 Claims, 12 Drawing Figures

FIG. 11
FIG. 12
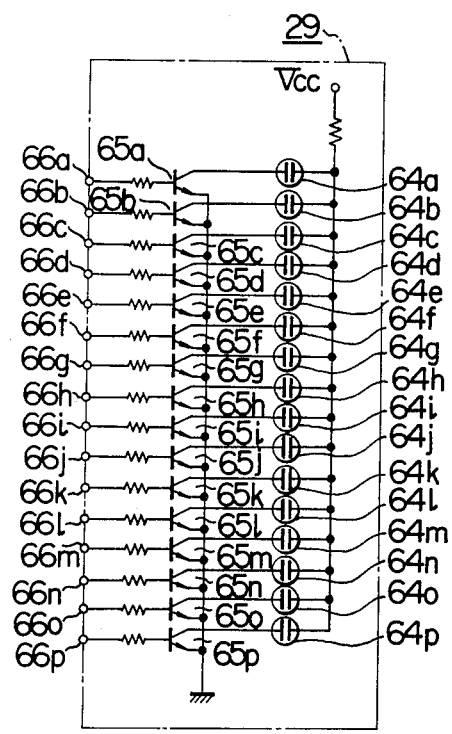
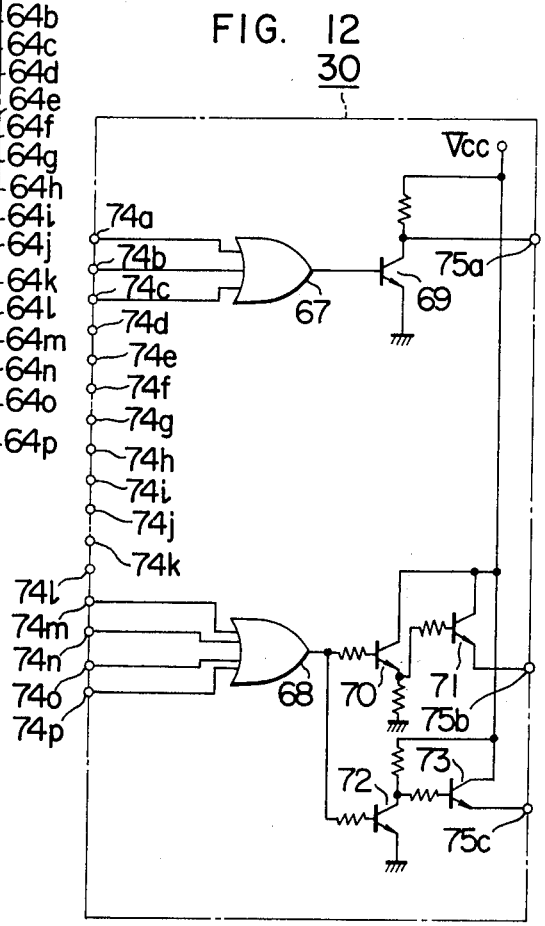

CHANNEL SELECTION APPARATUS PROVIDED WITH MEMORY FOR DIGITALIZING AND STORING CHANNEL SELECTION VOLTAGE

The present invention relates to a channel selection apparatus using a so-called "varactor tuner" which uses a voltage dependent variable reactance element such a varactor diode as a tuning element, for effecting channel selection by applying a selected channel selection voltage to the voltage-dependent variable reactance element.

A prior art channel selection apparatus, particularly that for use in a television receiver set uses a tuning capacitor or coil which is selected directly by a rotary switch or other mechanical switch. Accordingly, there has been an inconvenience in that the structure of the switching section was complex and of large size and expensive, and failure of the contacts of the switch occured during operation, which resulted in unstable operation.

As an approach toward overcoming the above difficulty, an apparatus has been proposed in which a voltage-dependent variable reactance element such as a varactor diode is used as a tuning element, and a number of variable resistors are provided for presetting the channel selection voltages, one for each of the channels. These voltages are applied to the variable reactance element, and a desired channel selection voltage is selected by sequentially selecting respective ones of the variable resistors using a keyboard and a binary circuit, for effecting the channel selection. In this case, however, there has been inconvenience in that the resistance values of the channel selection presetting variable resistors changed with the change of environment, and particularly in a high temperature or high humidity environment there were frequent contact failures and changes in resistance values which resulted in operational failure and low reliability.

It is, therefore, an object of the present invention to provide a channel selection apparatus capable of effecting stable channel selection operation despite elapses of time and changes in the environment.

It is another object of the present invention to provide a channel selection apparatus of high operability capable of sequentially selecting only those channels of the presettable channels which a user or operator has preset and skip the other channels without selecting them.

The above and other objects, features and advantages of the present invention will become more apparent from the following detailed description of prefered embodiments of the present invention when taken in conjunction with the accompanying drawings, in which:

FIG. 11 is a circuit diagram showing a specific configuration of a channel indicator used in the channel selection apparatus; and FIG. 12 is a circuit diagram showing a specific configuration of a band selection circuit used in the channel selection apparatus.

Figure 1:
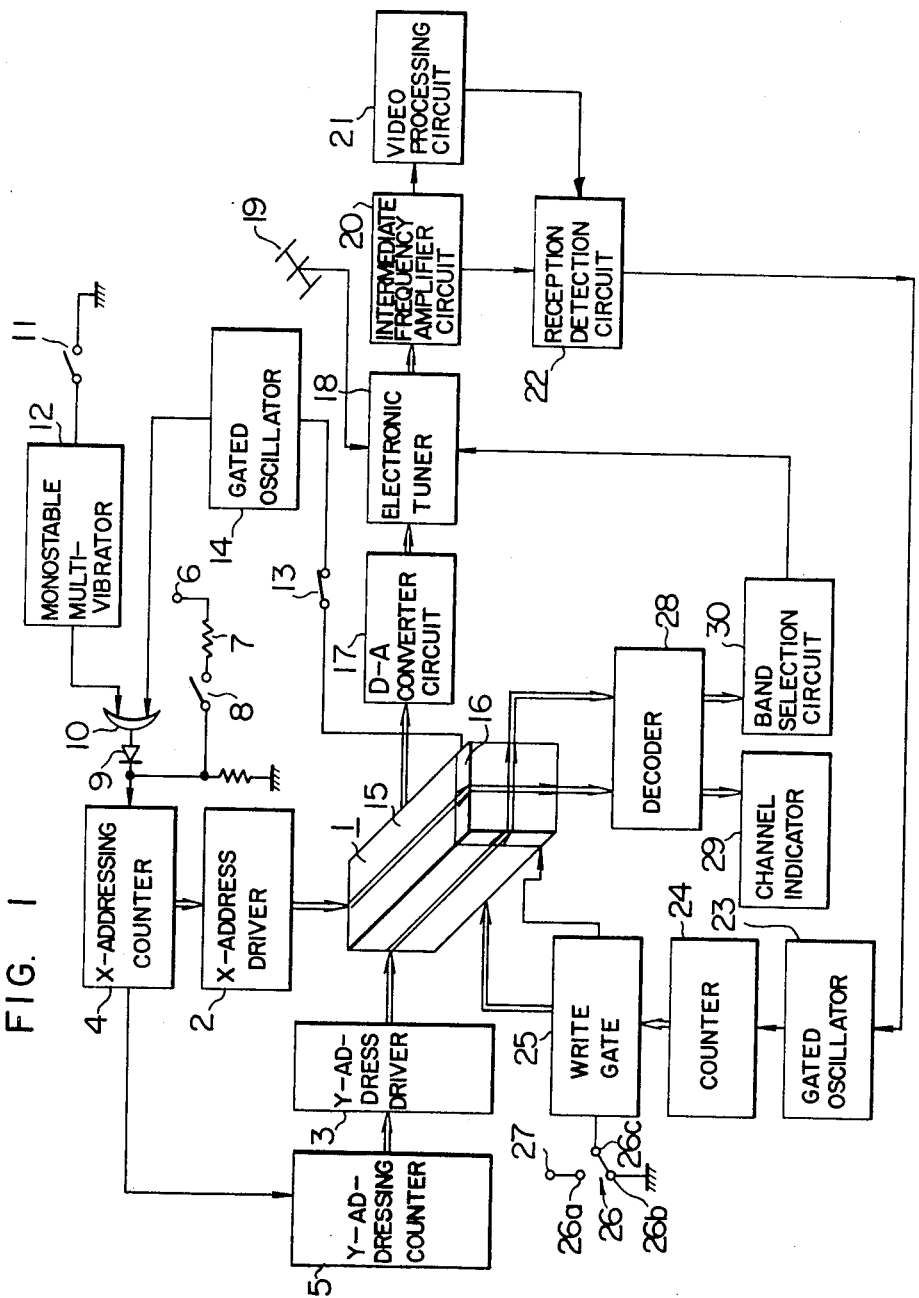
FIG. 1 is a block diagram showing an overall configuration of a channel selection apparatus in accordance with the present invention.

Referring first to FIG. 1, an overall configuration of the present apparatus is explained. In FIG. 1, a memory block, designated by numeral 1, can store different channel selection digital voltage signals in the form of 12-bit digital signal, one signal for each address. An X-address driver 2 and a Y-address driver 3 are connected to an X-addressing input terminal and a Y-addressing input terminal, respectively, of the memory block, for addressing. Each of the addresses corresponds to a respective one of the television channels being broadcast. An X-addressing counter 4 supplies a sequentially changing addressing signal to an input terminal of X-address driver 2, and a Y-addressing counter 5 supplies a sequentially changing addressing signal to an input terminal of the Y-address driver 3. The counter 5 is cascade-connected to the counter 4 so that when the counter 4 completes its full count it applies an input to the counter 5 to advance it by one count. The X-address driver 2, Y-address driver 3 and counters 4 and 5 cooperate to sequentially address the store addresses and read-out addresses in the memory block 1.

In order to apply pulses to the counter 4 to change the content thereof for changing the addressing signal, a series circuit comprising of a resistor 7 having one end connected to a power supply terminal 6 and a switch 8 is connected to an input terminal of the counter 4. The output terminal of an OR gate 10 is also connected through a diode 9 to the input terminal of counter 4. Connected to one input of the OR gate 10 is an output terminal of a monostable multivibrator 12 which produces a single short duration pulse when a switch 11 is closed, and connected to the other input of the OR gate 10 is an output terminal of a gated oscillator 14 which oscillates to sequentially produce pulses during the application of an input signal thereto through a switch 13, for effecting channel skip to be described later.

In addition to a memory section 15 for the 12-bit digital voltage signals, the memory block 1 includes a 1-bit memory board 16 which permits presetting for each of the addresses, so that channels corresponding to some addresses are selected while those corresponding to other address are not selected but skipped. The addressing of the memory board 16 is, of course, effected commonly with the addressing of the memory section 15 for the digital voltage signals. A readout terminal of the memory board 16 is applied to an oscillation control input terminal of the gated oscillator 14 through the switch 13.

On the other hand, the output of 12-bit digital voltage signal read out of a designated address of the memory block 1 is coupled to a digital input terminal of a D-A converter circuit 17 where the digital voltage signal is converted to an analog channel selection voltage. From an output terminal of the D-A converter circuit 17, the analog channel selection voltage is applied to a voltage-dependent variable reactance element in an electronic tuner 18, which, in turn, changes its channel selection frequency depending on the channel selection voltage so that it selects only one of the television broadcast signals received by an antenna 19 and frequency converts the selected signal to produce an intermediate frequency signal at an output terminal for supplying it to an intermediate frequency amplifier circuit 20 connected succeeding to the electronic tuner 18. A main output terminal of the intermediate frequency amplifier circuit 20 is coupled to a succeeding stage video processing circuit 21 for supplying it with an amplified intermediate frequency signal. Another intermediate frequency signal output terminal of the intermediate frequency amplifier circuit 20 and a horizontal synchronizing signal output terminal of the video processing circuit 21 are coupled to a reception detection circuit 22, which detects the reception of the broadcast signal only when both the intermediate frequency signal and the horizontal synchronizing signal are received the reception detection circuit 22 produces a detection output, which is then applied to an oscillation control input terminal of a gated oscillator 23 to be described later.

The gated oscillator 23 and the 12-bit binary counter 24 function to generate a binary coded digital voltage signal. That is, the oscillation output of the gated oscillator 23 is applied to the up-down counter 24, which count the oscillation output to generate the gradually increasing 12-bit digital voltage signal. When the detection output from the output terminal of the reception detection circuit 22 is applied to the oscillation control input terminal of the gated oscillator 23, it stops oscillating and the counter 24 maintains the content at that moment. The 12-bit digital voltage output terminal of the counter 24 is connected to input terminals of a write gate 25 comprising twelve separate gates, a 12-bit output terminal of which is connected to a 12-bit input terminals of the digital voltage signal memory section 15 in the memory block 1 to supply the digital voltage signal to the memory block 1. A gate control signal input terminal of the write gate 25 is connected to a movable arm 26c of a write control switch 26, a write instruction stationary contact 26a of which is connected to a power supply terminal 27 while non-write instruction stationary contact 26b is grounded. The movable arm 26c of the switch 26 is further connected to the input terminal of the memory board 16 for channel skipping setting in the memory block 1 to write a skip control signal (which is at high level when a channel is to be selected and at low level when it is to be skipped) in the memory board 16 simultaneously with the writing of the digital voltage signal into the memory section 15.

Furthermore, the X-addressing and Y-addressing terminals of the memory block 1 are connected to an input terminal of a signal translating decoder 28 which has as many output terminals as the number of addresses of the memory block 1 and produces an output only at an output terminal corresponding to that specified by the X-addressing and Y-addressing signals. An output terminal of the decoder 28 is, on the one hand, connected to an input terminal of a channel indicator 29, which indicates which address in the memory block 1 is addressed, that is, which channel is selected. The output terminal of the decoder 28 is, on the other hand, connected to an input terminal of a band selection circuit 30 to detect which address in the memory block 1 is addressed and discriminates whether the specified address belongs to a VHF low channel (CH1–CH3), or a VHF high channel (CH4–CH12), or a UHF channel and produces a different output depending on the discrimination result. An output terminal of the band selection circuit 30 is connected to a power supply input terminal or a power supply switching control terminal for a VHF tuner and a UHF tuner in the electronic tuner 18 and to a coil switching control input terminal for the VHF low channel and the VHF high channel in the VHF tuner, for switching the electronic tuner 18 to operate in a band in which the channel specified by the memory block 1 is contained.

More specific configurations of major sections of the above apparatus will now be explained in connection with FIGS. 2 to 12.

Figure 2:
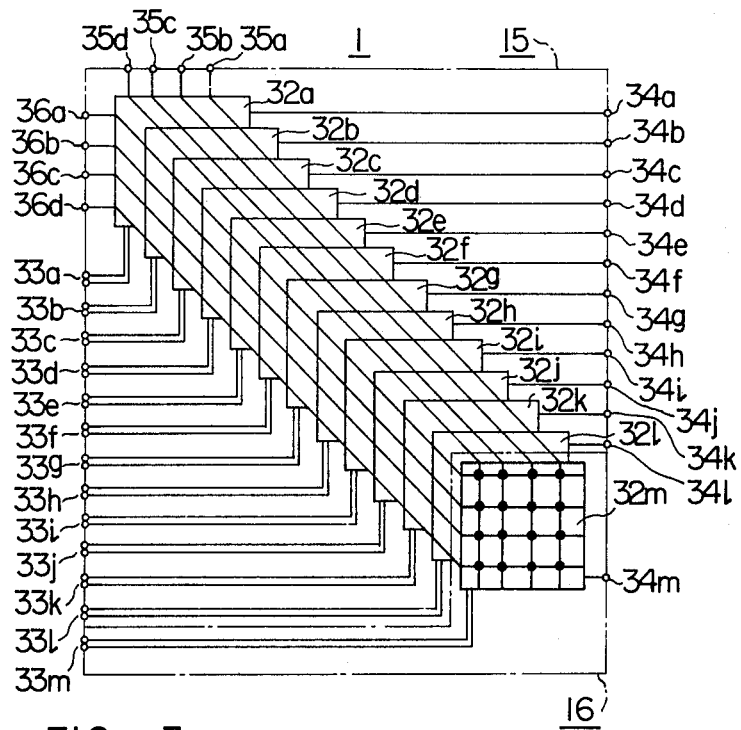
FIG. 2 is a circuit diagram of a memory block used in the apparatus.
Figure 3:
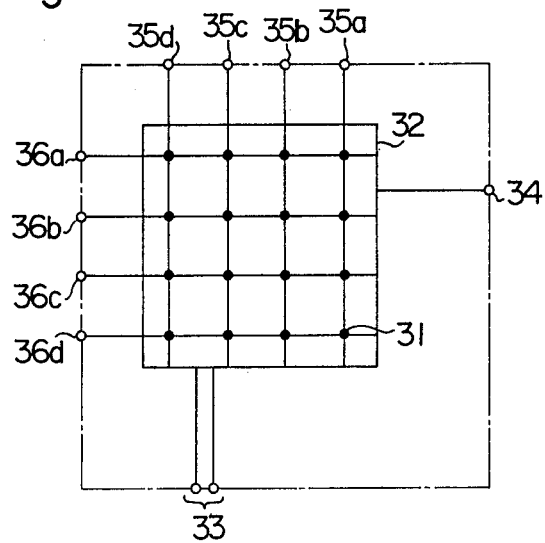
FIG. 3 is a circuit diagram of a memory unit in the memory block.

FIGS. 2 and 3 show the memory block 1 which comprises thirteen memory units 32a to 32m each including sixteen memory elements 31, four rows in the X axis direction and four columns in the Y axis direction, as shown in FIG. 3. Of those memory units, twelve memory units 32a to 32l are used as the digital voltage signal memory section 15 with a 12-bit digital voltage signal being stored one bit at each of the memory units 32a to 32l, while the remaining memory unit 32l is used as the memory board 16 for storing the channel skip control signal. The memory units 32a to 32m are each provided with input terminals 33a to 33m for writing the digital voltage signals and the channel skip control signals into the memory elements 31, and output terminals 34a to 34m for reading those signals out of the memory element 31, and there are further provided input terminals 35a to 35d, 36a to 36d for X-addressing and Y-addressing signals. The input terminals 35a to 36d for the addressing signals are connected in common to all of the memory units 32a to 32m to allow addressing of the same address for the memory units 32a to 32m.

Figure 4:
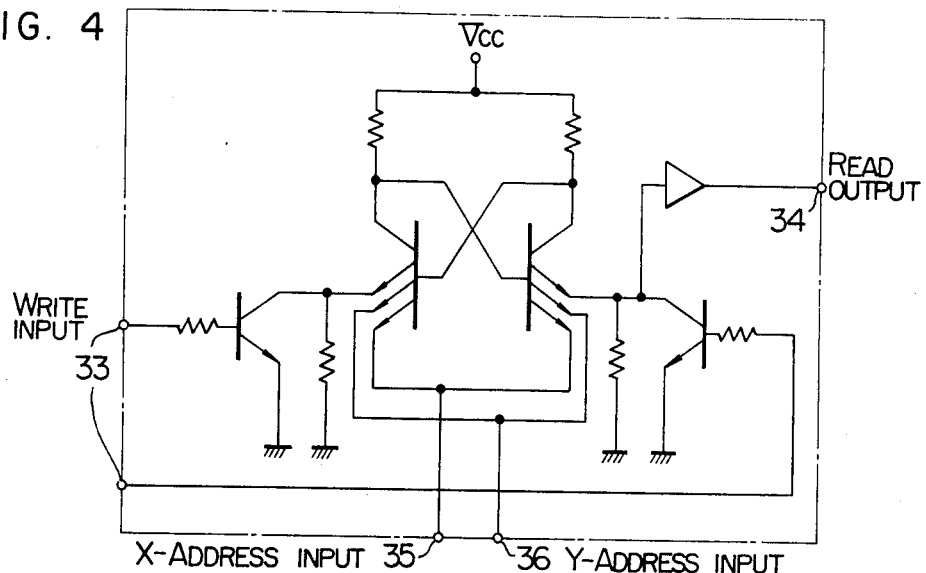
FIG. 4 is a diagram showing a specific configuration of a memory element in the memory block.

One particular example of a circuit diagram of a memory element 31 which may be used in the memory block 1 is shown in FIG. 4. It comprises a conventional flip-flop using multi-emitter transistors, detailed explanation of which is omitted here. A signal can be written from an input terminal 33 or a signal stored can be read out at an output terminal 34 only when both an X address input terminal 35 and a Y address input terminal 36 have received high level addressing signals. In other states, no output is produced at the output terminal 34.

Any other memory elements such as those using magnetic cores or MNOS transistors may be used as the memory element 31, and preferably they are non-volatile memory elements the memory contents of which are not extinguished even when the power supply thereto is turned off.

Figure 5:
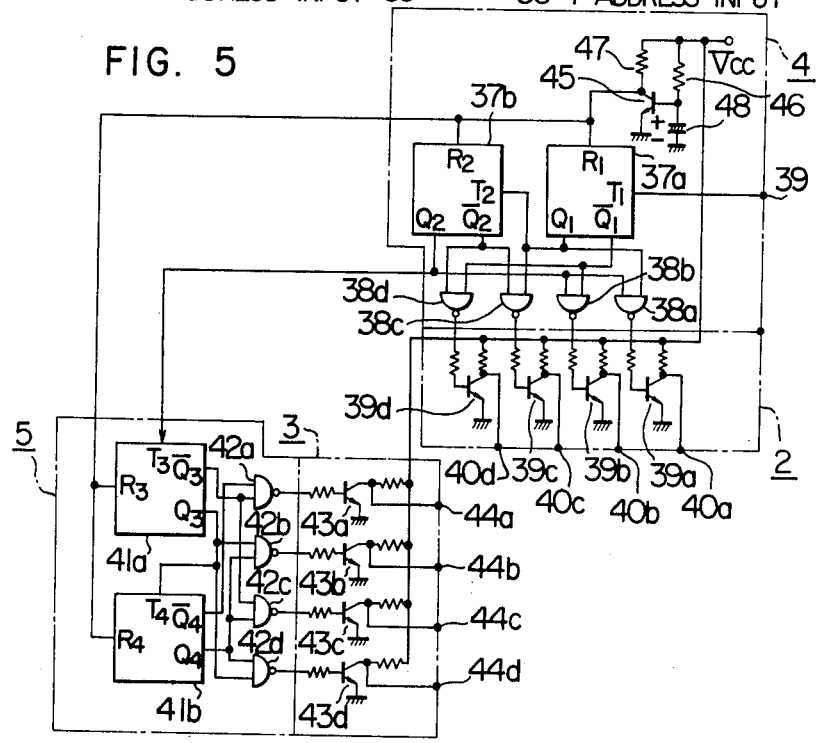
FIG. 5 is a circuit diagram showing a specific configuration of a counter and X and Y address drivers used in the channel selection apparatus.

FIG. 5 shows a particular example of a circuit diagram of the X address driver 2, Y address driver 3 and counters 4 and 5 for addressing the memory block 1 for writing or reading. The counter 4 comprises two cascade-connected flip-flops 37a and 37b, and has gates 38a to 38d connected to an output thereof. Each time a pulse is applied to an input terminal 39, the flip-flops 37a and 37b count up and produces a low level output at the gates 38a to 38d in the order of 38a → 38b → 38c → 38d → 38a.... Output terminals of the gates 38a to 38d are connected to bases of transistors 39a to 39d in the X address driver 2 to produce a high level X addressing signal sequentially from the collectors of the transistors 39a to 39d to output terminals 40a to 40d, which are connected to X addressing signal input terminals 35a to 35d of the memory block 1.

The counter 5 comprises two cascade-connected flip-flops 41a and 41b, and has gates 42a to 42d connected to an output thereof. Each time the output of the flip-flop 37b falls, the flip-flops 41a and 41b count up and produce a low level output at the gates 42a to 42d in the order of 42a → 42b → 42c → 42d → 42a.... Outputs of the gates 42a to 42d are connected to the bases of transistors 43a to 43d in the Y address driver 3 to produce a high level Y addressing signal sequentially from collectors of the transistors 43a to 43d to output terminals 44a to 44d which are connected to Y addressing signal input terminals 36a to 36d of the memory block 1.

With the above arrangement, the addresses in the memory block 1 can be sequentially addressed for reading or writing. Let us assume that the addressing is conducted in the order of CH1 → CH2 → ... CH12 → UHF1 → UHF2 → UHF3 → UHF4 → CH1 .... The counter 4 is further provided with an initial resetting circuit comprising a transistor 45, resistors 46, 47 and a capacitor 48 so that when the power is turned on the transistor 45 produces a single reset pulse which is applied to reset terminals of the flip-flops 37a, 37b, 41a, 41b to reset them at the initial moment of the power-on. When reset, the CH1 is addressed and the addressing starts from the CH1.

Figure 6:
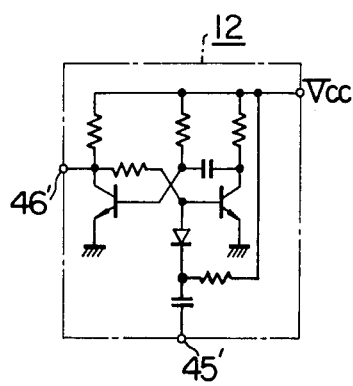
FIG. 6 is a circuit diagram showing a specific configuration of a monostable multivibrator used in the channel selection apparatus.

FIG. 6 shows a particular example of the monostable multivibrator 12 for applying a channel selection switching pulse to the counter 4. The circuit configuration thereof is conventional and hence detailed explanation thereof is omitted here. An input terminal 45' is connected to the switch 11 and a pulse output terminal 46' is connected to one of the input terminals of the gate 10.

Figure 7:
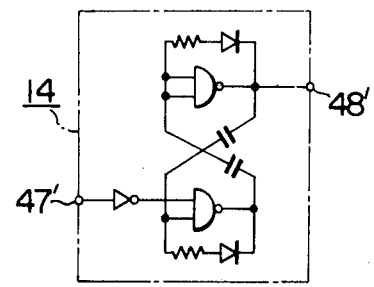
FIG. 7 is a circuit diagram showing a specific configuration of a gated oscillator used in the channel selection apparatus.

FIG. 7 shows a particular example of a circuit diagram of the gated oscillator 14 for applying a channel skipping pulse to the counter 4 when a channel is to be skipped. The circuit configuration is a conventional one using an astable multivibrator and hence detailed description thereof is omitted here. An input terminal 47' is connected to the switch 13 and a pulse output terminal 48' is connected to the other input terminal of the gate 10. When a low level signal is applied to the input terminal 47 the gated oscillator 14 oscillates to produce pulses.

Figure 8:
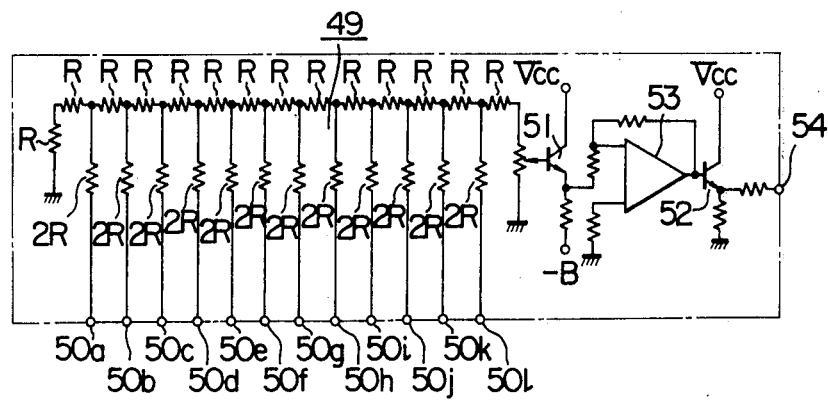
FIG. 8 is a circuit diagram showing a specific configuration of a D-A converter used in the channel selection apparatus.

FIG. 8 shows a particular example of a circuit diagram of the D-A converter 17 which converts a 12-bit digital voltage signal read out of the memory section 15 of the memory block 1 to an analog channel selection voltage for applying it to a voltage-dependent variable reactance element in the electronic tuner 18. In the illustrated example, a resistor group 49 comprising a number of resistors is provided, and twelve input terminals 50a to 50l thereof are connected to the readout terminals 34a to 34l, respectively, of the digital voltage signal memory section 15 in the memory block 1. Provided at the output of the resistor group 49 are transistors 51 and 52 for impedance conversion and a D.C. amplifier 53 for producing an amplified channel selection voltage at the output terminal 54 which is connected to the voltage-dependent variable reactance element of the electronic tuner 18.

Figure 9:
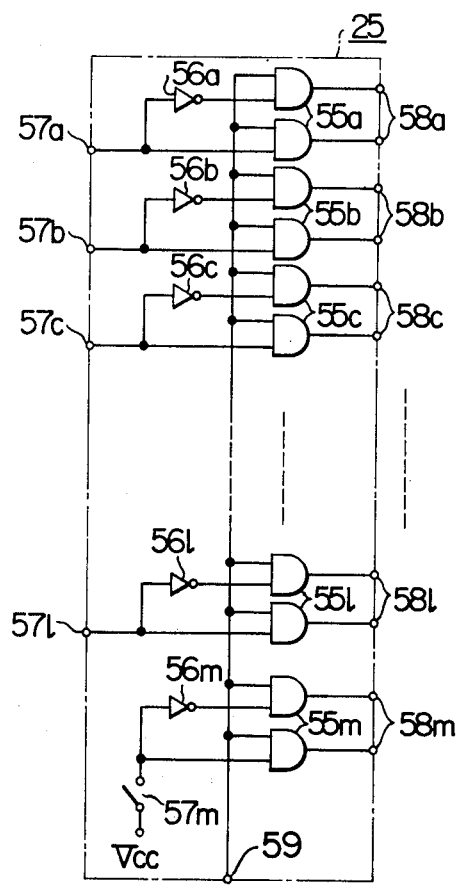
FIG. 9 is a circuit diagram showing a specific configuration of a write gate used in the channel selection apparatus.

FIG. 9 shows a particular example of a circuit diagram of the write gate 25 which controls the writing of a digital voltage signal into the memory block 1. It comprises a set of gates 55a to 55l for writing twelve sets of digital voltage signal, inverters 56a to 56l, a set of gate 55m for writing a set of channel skip control signal, an inverter 56m and a switch 57m. The twelve input terminals 57a to 57l are connected to respective ones of the 12-bit count output terminals of the counter 24, and the thirteen output terminals 58a to 58m are connected to the 12-bit digital voltage signal input terminals 33a to 33l of the memory block 1 and the channel skip control signal input terminal 33m of the memory board 16. One of the input terminals of each of the gates 55a to 55m is connected in common with each other and to the movable arm 26c of the write control switch 26 from the control input terminal 59. The switch 57m is closed only when a high level channel skip control signal is to be written. Accordingly, the write gate 25 opens only when the switch 26 is thrown to the stationary contact 26a coupled to the power supply terminal 27 to gate the 12-bit digital voltage signal from the counter 24 and the channel skip control signal from the switch 57m to the memory block 1 to write them therein. When the switch 26 is thrown to the stationary contact 26b, the write gate 25 is blocked to inhibit writing into the memory block 1.

The counter 24 is a conventional 12-position binary counter, which counts pulses from the gated oscillator 23 to produce a sequentially increasing or decreasing 12-bit digital voltage signal. Because of the 12-bits, $2^{12}$ (= 2048) different outputs can be produced. When a voltage step per count is set to 0.02 volt, the channel selection voltage in the range of 0–40.96 volts in the form of binary coded digital voltage signal can be produced at a 0.02 volt volt step. For example, 2.00 volts may be represented by "000001100100", and 24.10 volts by "010010110101". The voltage step per count is, of course, the same as that in the D-A converter 17. In this manner, the counter 24 sweep the binary coded channel selection voltage.

A particular configuration of the gated oscillator 23 may be identical to that of the gated oscillator 14 shown in FIG. 6 except that the oscillation period is shorter. The gated oscillator 23 stops generating pulses when a detection output from the reception detection circuit 22 is applied thereto to inhibit the operation of the counter 24, that is, the sweep of the digital voltage signal.

Figure 10:
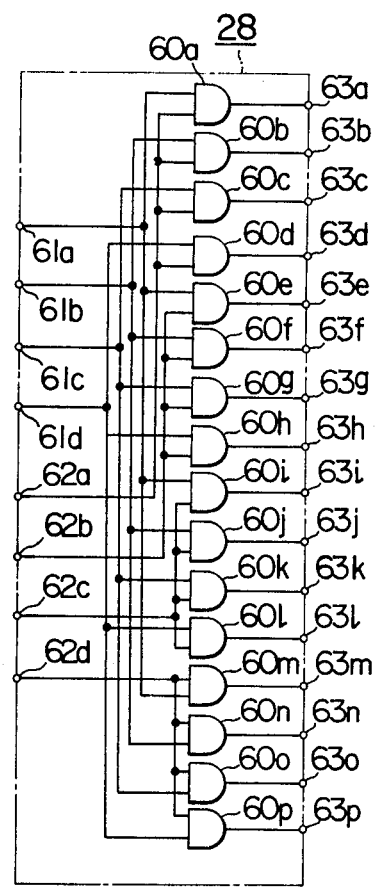
FIG. 10 is a circuit diagram showing a specific configuration of a decoder used in the channel selection apparatus.

FIG. 10 is a particular example of a circuit diagram of the decoder 28 which distinguishes a channel address specified in the memory block 1 and produces a discrimination output. It comprises sixteen gates 60a to 60p, and eight input terminals 61a to 61d, 62a to 62d are connected to the X addressing terminals 35a to 35d and the Y addressing terminals 36a to 36d of the memory block 1, respectively. Accordingly, in response to addressing of the memory block 1 by the X address driver 2 and the Y address driver 3, a corresponding one of the gates 60a to 60p conducts to produce the discrimination output at one of the sixteen output terminals 63a to 63p. In the illustrated example, the output is produced at the output terminal 63a when the address of the CH1 is specified, at the output terminal 63b when the address of the CH2 is specified, ..., at the output terminal 63l when the address of the CH12 is specified, at the output terminal 63m when the address of UHF1 is specified, ..., at the output terminal 63p when the address of the UHF4 is specified.

FIG. 11 shows a particular example of a circuit diagram of the channel indicator 29 for indicating the channel selected, in response to the output from the decoder 28. It comprises sixteen neon lamps 64a to 64p for channel indication and sixteen transistors 65a to 65p having their collectors connected to the neon lamps 64a to 64p for lighting them. Input terminals 66a to 66p coupled to the bases of the transistors 65a to 65p are connected to the output terminals 63a to 63p of the decoder 28. Accordingly, it is possible to indicate the channel specified in the memory block 1. When indication films bearing channel numbers thereon are positioned in front of the neon lamps 64a to 64p, the channel numbers can be directly displayed. 7-segment numeric display tubes may be used.

Finally, FIG. 12 shows a particular example of a circuit diagram of the band selection circuit 30 which switches the operation band of the electronic tuner 18 using the output from the decoder 28. It comprises a gate 67 for the VHF low channel, a gate 68 for UHF, a transistor 69 connected to an output terminal of the gate 67 and transistors 70 to 73 connected to output terminal of the gate 68. Sixteen input terminals 74a to 74p are connected to the output terminals 63a to 63p of the decoder 28. Output terminal 75a is connected to the coil switching control input terminal of the VHF low channel selection in the electronic tuner 18, output terminal 75b is connected to the power supply switching control terminal of the VHF tuner in the electronic tuner 18, and output terminal 75c is connected to the power supply switching control terminal of the UHF tuner in the electronic tuner 18.

In the memory block 1, when an address for one of the CH1 to CH3 channels, that is, those in the VHF low channel band, is specified, a high level input is applied to one of the input terminals 74a to 74c so that the OR gate produces an output causing the transistor 69 to conduct which in turn produces a low level output at its output terminal 75a to switch the coil of the VHF tuner in the electronic tuner for the VHF low channel selection. At the same time, since the output from the gate 68 is absent at this time, the transistor 70 is turned off and the transistor 71 conducts to produce an output at the output terminal 75b for supplying power to the VHF tuner in the electronic tuner 18. Since the transistors 72 and 73 are cut off at this time and no power is supplied to the UHF tuner in the electronic tuner 18, the UHF tuner is not actuated.

On the other hand, when one of the addresses for the CH4 to CH12 channels, that is, those in the VHF high channel band, is specified, an output is again produced at the output terminal 75b and power is supplied to the VHF tuner. Since the output at the terminal 75a changes to a high level, the coil in the VHF tuner is switched to the VHF high channel to permit the selection of the VHF high channel. Again the VHF tuner is supplied with power.

When one of the addresses for the UHF channels is specified, a high level input is applied to one of the input terminals 74m to 74p so that the gate 68 produces a high level output and the transistors 72 and 73 conduct causing an output to be generated at the output terminal 75c, which output connects the supply of power to the UHF tuner in the electronic tuner 18. Thus, the UHF tuner is actuated to permit selection of the UHF channels. Since the transistor 70 conducts and the transistor 71 is non-conductive at this time, the VHF tuner is not supplied with power.

The operation of the above construction is now described.

The operation of pre-writing and storing the digital voltage signals and the channel skip control signals into the memory block 1 will be explained first. Let us assume that the channels to be selected are six channels including VHF CH1, CH2, CH5, CH10 and UHF1, UHF4, and no other channel is to be selected but skipped. During the following write operation, the switches 8 and 13 are kept opened.

When the power is initially turned on, the counters 4 and 5 are reset and the address in the memory block 1 specifies the address for the CH1 channel. Then, since the CH1 is to be selected, the switch 57m is closed and the switch 26 is thrown to the stationary contact 26a to write in the address for the CH1 of the memory board 16 in the memory block 1 a high level channel skip control signal which indicates that the channel is to be selected. At the same time, through the operation of the switch 26, the write gate 25 is opened to gate a 12-bit digital voltage signal from the counter 24 to the address for the CH1 in the memory section 15 of the memory block 1. This digital voltage signal is read out of the memory block 1 simultaneously with the writing therein, and converted by the D-A converter circuit 17 to an analog channel selection voltage, which is, in turn, applied to the voltage-dependent reactance element of the electronic tuner 18. At this time, since the band of the electronic tuner 18 has been selected to enable the VHF low channel selection, as explained above in connection with FIG. 11, the VHF low channels are selected by the channel selection voltage from the D-A converter 17. However, since the count in the counter 24 has a small value during the initial stage, the digital voltage generated by the counter 24 is smaller than the digital voltage signal for a channel selection voltage which is appropriate to select the CH1, so that the electronic tuner 18 does not yet receive a CH1 broadcast signal. Under this condition, therefore, no detection output is produced from the reception detection circuit 22, and the gated oscillator and supply 23 continues to oscillate pulses to the counter 24 to continuously count up the counter 24 or increase the digital voltage signal. The channel selection voltage applied to the electronic tuner 18 is thereby swept toward a larger value. When the digital voltage signal of the counter 24 reaches a magnitude which is just sufficient to receive the CH1 signal, the electronic tuner 18 receives the CH1 signal. When this occurs, the reception detection circuit 22 produces the detection output, by which the gated oscillator 23 is caused to stop oscillating to inhibit the increase of the digital voltage signal from the counter 24. Thus, the digital voltage signal for selecting the CH1 is supplied to the memory block 15. By throwing the switch 26 to the stationary contact 26b, the digital voltage signal for selecting the CH1 can be fixed in the memory block 1 while it is written. In this manner the write operation of the digital voltage signal for the CH1 selection and the high level channel selection signal into the memory block 1 is completed.

Next, switch 11 is operated once to apply a pulse from the monostable multivibrator 12 to the counter 4 to step the address to the memory block 1 by one for specifying the address for the CH2. Since the CH2 is also one of the channels to be selected, the digital voltage signal which is appropriate to allow the selection of the CH2 is produced by the same operation as for the CH1, and the digital voltage signal for the CH2 selection and the high level channel skip control signal are written into the memory block 1. In generating and writing the CH2 digital voltage signal, since the content of the counter 24 initially maintains the digital voltage signal for the CH1 selection, if the switch 26 is thrown to the stationary contact 26a under this condition to open the gate 25, the electronic tuner 18 will receive the CH1 signal to stop the gated oscillator 23 so that the digital voltage signal for the CH2 selection cannot be produced. Accordingly, when the address to the memory block 1 is to be modified within the same channel band, it may be sufficient to inhibit the application of the output of the reception detection circuit 22 to the gated oscillator 23 for a short period or to design the gated oscillator 23 to oscillate independently of the output of the reception detection circuit 22 and cause the gated oscillator 23 to oscillate to cause the counter 24 to generate a digital voltage signal 1 the magnitude of which is beyond the range which enables the selection of the CH1. The control of the above short period may be effected by applying the output of the monostable multivibrator 12 to the reception detection circuit 22 or the gated oscillator 23.

Then, the switch 11 is again operated to apply a pulse to the counter 4 to advance the address to the memory block 1 by one to specify the CH3. Since the CH3 is not to be selected but skipped, switch 26 is thrown to the stationary contact 26b and the digital voltage signal is not written into the memory section 15 of the memory block 1 and the high voltage skip control signal is not written into the memory board 16. Rather, a low level skip control signal is written therein.

Then, the switch 11 is further operated to advance the address to the memory block 1 to the address for the CH4. Since the CH4 is also not to be selected, the same operation as for the CH3 is repeated.

Next, the switch 11 is operated to advance the address to the memory block 1 to the address for the CH5. Since the CH5 is to be selected, the digital voltage signal and the high level skip control signal are written into the memory block 1 in the same manner as for the CH1 and CH2. Since the band changes to the VHF high channel band beyond the CH4, the electronic tuner 18 is switched to the VHF high channel selection condition by the output from the band selection circuit 30. When the selection bands of the electronic tuner 18 are to be switched, since the range of the channel selection voltages applied to the voltage-dependent variable reactance element for the respective selection bands are usually not separate but overlap each other, it is convenient to reset the counter 24 for generating the digital voltage signal simultaneously with the band selection. The resetting of the counter 24 may be effected by applying an output signal for the band selection from the band selection circuit 30 to the reset terminal of the counter 14.

Similarly, the switch 11 is operated to step the address to the memory block 1 one by one with the channel selection digital voltage signals appropriate to select the channels and the high level skip control signals for the channel selection being written into the memory block 1 at the CH10, UHF1 and UHF4 while no digital voltage signal and the low level skip control signal for the channel skip is written into the memory block at the CH6, CH7, CH8, CH9, CH11, CH12, UHF2 and UHF3.

In this manner the write and store operation of the digital voltage signals and the skip control signals into the memory block 1 is completed. During the subsequent channel selection operation, the switch 26 is thrown to the stationary contact 26b so that the digital voltage signals the skip control signals for the respective channels are sequentially read out of the memory block 1 while the content of the memory block 1 is maintained. When it is desired to additionally write a new digital voltage signal and skip control signal into the memory block 1, or to modify the content of the memory block 1, the operation described above may be repeated.

The channel selection operation for receiving a television broadcast using the memory block 1 having the voltage signals stored therein in the manner described above will now be explained.

During the channel selection operation, the switch 13 is closed in order to enable selection of only those channels which have been preset by the skip control signal, that is, in the above example the CH1, CH2, CH5, CH10, UHF1 and UHF4.

When the power is switched on, the counters 4 and 5 are reset so that the address for the CH1 of the memory block 1 is specified. At this time, the high level skip control signal is stored at the address for the CH1 of the memory board 16, which is then read out and supplied to the gated oscillator 14 through the switch 13 so that the gated oscillator 14 does not oscillate and the counters 4 and 5 do not change their contents. As a result, the digital voltage signal for the selection of the CH1 is read out of the memory block 1, which signal is converted to an analog channel selection voltage by the D-A converter 17 for application to the voltage-dependent variable reactance element of the electronic tuner 18. On the other hand, the decoder 28 detects the addressing to the CH1 in the memory block 1 and produces an output at the CH1 output terminal 63a so that the band selection circuit 30 operates to switch the electronic tuner 18 to the VHF low channel selection state. Consequently, the electronic tuner 18 selects the CH1 broadcast signal, which is then supplied to the intermediate frequency amplifier circuit 20 and the video processing circuit 21 to receive the CH1 television broadcast. At the same time, in the channel indicator 29, the CH1 transistor 65a is caused to conduct by the output at the CH1 output terminal 63a from the decoder 28, to light the neon lamp 64a thereby indicating that the CH1 is being selected.

Next, either channel selection switch 8 or 11 is operated to apply a pulse to the counter 4 so that the counters 4 and 5 specify the address for the CH2 of the memory block 1. At this time, since the skip control signal at the address for the CH2 of the memory board 16 is at a high level, the gated oscillator 14 does not oscillate, and the CH2 television broadcast is selected and received in the same manner as for the CH1.

The switch 8 or 11 is again operated to apply a pulse to the counter 4 so that the counters 4 and 5 specify the address for the CH3 of the memory block 1. Since the CH3 is not to be selected but skipped and the low level skip control signal for skipping is stored at the CH3 address of the memory board 16, the low level skip control signal is read out and applied to the gated oscillator 14 through the switch 13. Consequently, the gated oscillator oscillates to produce a pulse which is supplied to the counter 4 so that the contents of counters 4 and 5 change from the CH3 address to the CH4 address. In this manner, when the skip control signal is of low level for the skipping, the channel is not selected but skipped.

Thus, the CH4 address is specified. Since the CH4 is also to be skipped, the gated oscillator 14 oscillates to produce a pulse in the same manner as for the CH3 to step the counters 4 and 5 to the CH5 address.

Since the CH5 is to be selected and the CH5 address of the memory board 16 stores the high level skip control signal, this signal is read out and applied to the gated oscillator 14 which then stops oscillating. As a result, the counters 4 and 5 maintain the addressing of the CH5 and the digital voltage signal for the selection of the CH5 is read out of the memory block 1 and the CH5 television broadcast signal is selected and received by the electronic tuner 18. The channel indicator 29 lights the CH5 neon lamp 64e and the band selection circuit 30 switches the electronic tuner 18 to the VHF high channel selection state. In this manner, by operating the switch 8 or 11 only once when selecting the CH2, the CH3 an CH4 can be skipped without being selected and the CH5 which is the one to be selected next can be automatically selected.

Similarly, each time the switch 8 or 11 is operated, those channels for which the high level skip control signals for channel selection have been previously stored in the memory board 16 can be sequentially selected while the intermediate channels are not selected but skipped.

As described above, since the channels desired to be selected are previously stored in the memory board 16 to enable the skipping of a channel, it is possible not to select the channels which include no broadcast signals and select only the channels which include the broadcast signals, or to skip the channels which include the broadcast signals but need not be selected. Accordingly, the troublesome manual operation of operating the channel selection knob channel by channel and manually skipping the non-broadcasting channel or undesired channel, has been overcome.

When the channel skipping is not to be effected, the switch 13 is opened.

While the digital voltage signal and the skip control signal are simultaneously written into the memory block 1 by the single switch 26 in the above embodiment, the digital voltage signal and the skip control signal may be separately written. In particular, the digital voltage signals may be written into the addresses for all channels of the memory block 1 irrespective of the selection or skip and the skip control signals may be selectively written depending on whether the channel is to be selected or skipped.

As described hereinabove, according to the present invention, since the channel selection voltages to be applied to the voltage-dependent variable reactance element of the electronic tuner are not established by variable resistors but stored in the memory block in the form of the binary coded digital voltage signal, the channel selection can be effected purely electronically without requiring mechanical voltage setting elements or rotary switches and hence a stable channel selection operation which is not affected by changes in the environment such as temperature and humidity can be attained.

Furthermore, since the addresses of the memory block store, in addition to the digital voltage signals, the skip control signals for instructing whether the channels of the corresponding addresses are to be selected or not to be selected but skipped, and during the channel selection operation the skip control signals are read out to enable the skipping of the channels not to be selected and the selection of only those channels which have been preset, the channel selection operation has become very easy.

What is claimed is:

1. A channel selection apparatus comprising;
   an electronic tuner using a voltage-dependent variable reactance element as a turning element,
   a memory block having a plurality of memory addresses which are addressed in the matrix state by an X-address and a Y-address, said memory block storing digital voltage signals at said memory addresses which are digital versions of a plurality of channel selection voltages to be applied to said voltage-dependent reactance element for selecting a plurality of channels, said memory block further storing skip control signals for controlling whether the channels corresponding to the respective memory addresses are to be selected or to be skipped,
   an addressing circuit for specifying an address to be read out of said memory block comprising an X-addressing counter for addressing an X-address of said memory block and a Y-addressing counter for addressing a Y-address of said memory block, said Y-addressing counter being controlled by the final bit output of said X-addressing counter,
   a switch,
   a monostable multivibrator for generating a pulse signal when said switch is operated, said multivibrator supplying a pulse signal to said X-addressing counter for shifting the read-out address by one address,
   a skipping pulse generating circuit connected to the output of said memory block for activating said addressing circuit to step the readout address by one when said skip control signal read out of said memory block at the address specified by said addressing circuit indicates that a skipping pulse is to be supplied to said X-addressing counter, and
   a digital to analog converter for converting the digital voltage signals read out of said memory block at the address specified by said addressing circuit to an analog channel selection voltage for application to the voltage-dependent variable reactance element of said electronic tuner.

2. A channel selection apparatus according to claim 1 wherein said skipping pulse generating circuit includes a gated oscillator which oscillates to generate a pulse only when said skip control signal indicates that a channel is to be skipped.

3. A channel selection apparatus according to claim 1 further including a decoder for determining to which channel the memory address of said memory block specified by said addressing circuit corresponds, a channel indicator for indicating the channel being specified in response to an output from said decoder, and a band selection circuit for switching operation bands of said electronic tuner in response to an output from said decoder.

4. A channel selection switch according to claim 1 further including a counter having a multibit output for producing said digital voltage signals to be written into said memory block, and an oscillator for supplying counting pulses to said counter.

5. A channel selection apparatus according to claim 4 further including a reception detection circuit for detecting the signal reception by said electronic tuner, the oscillation of said oscillator being stopped when said reception detection circuit generates a detection output.

* * * * *